United States Patent
Grand et al.

(10) Patent No.: US 9,647,151 B2
(45) Date of Patent: May 9, 2017

(54) CHECKING THE STOICHIOMETRY OF I-III-VI LAYERS FOR USE IN PHOTOVOLTAIC USING IMPROVED ELECTROLYSIS CONDITIONS

(75) Inventors: Pierre-Philippe Grand, Rousset (FR); Salvador Jaime, Rousset (FR); Philippe De Gasquet, Rousset (FR); Hariklia Deligianni, Yorktown Heights, NY (US); Lubomyr T. Romankiw, Yorktown Heights, NY (US); Raman Vaidyanathan, Yorktown Heights, NY (US); Qiang Huang, Yorktown Heights, NY (US); Shafaat Ahmed, Yorktown Heights, NY (US)

(73) Assignee: NEXCIS, Rousset (FR)

( * ) Notice: Subject to any disclaimer, the term of this patent is extended or adjusted under 35 U.S.C. 154(b) by 664 days.

(21) Appl. No.: 13/879,703

(22) PCT Filed: Oct. 10, 2011

(86) PCT No.: PCT/FR2011/052363
§ 371 (c)(1),
(2), (4) Date: Apr. 16, 2013

(87) PCT Pub. No.: WO2012/052657
PCT Pub. Date: Apr. 26, 2012

(65) Prior Publication Data
US 2013/0206233 A1 Aug. 15, 2013

(30) Foreign Application Priority Data
Oct. 18, 2010 (FR) ...................................... 10 58457

(51) Int. Cl.
*H01L 31/0264* (2006.01)
*C25D 5/10* (2006.01)
(Continued)

(52) U.S. Cl.
CPC ............ *H01L 31/0264* (2013.01); *C25D 5/10* (2013.01); *C25D 7/0692* (2013.01); *C25D 21/12* (2013.01);
(Continued)

(58) Field of Classification Search
CPC .................................................... H01L 31/0264
See application file for complete search history.

(56) References Cited

U.S. PATENT DOCUMENTS

| | | | |
|---|---|---|---|
| 4,581,108 | A | 4/1986 | Kapur et al. |
| 5,312,532 | A | 5/1994 | Andricacos et al. |

(Continued)

FOREIGN PATENT DOCUMENTS

| | | |
|---|---|---|
| FR | 2 839 201 | 10/2003 |
| FR | 2 849 532 | 7/2004 |

(Continued)

OTHER PUBLICATIONS

International Search Report dated Jul. 17, 2012 for Application No. PCT/FR2011/052363.
(Continued)

*Primary Examiner* — Golam Mowla
(74) *Attorney, Agent, or Firm* — Frost Brown Todd LLC (57) ABSTRACT

The invention relates to manufacturing a I-III-VI compound in the form of a thin film for use in photovoltaics, including the steps of: a) electrodepositing a thin-film structure, consisting of I and/or III elements, onto the surface of an electrode that forms a substrate (SUB); and b) incorporating at least one VI element into the structure so as to obtain the I-III-VI compound. According to the invention, the electrodeposition step comprises checking that the uniformity of the thickness of the thin film varies by no more than 3% over the entire surface of the substrate receiving the deposition.

14 Claims, 3 Drawing Sheets (51) Int. Cl.
  *C25D 7/06* (2006.01)
  *C25D 21/12* (2006.01)
  *H01L 31/032* (2006.01)
  *H01L 21/02* (2006.01)
(52) U.S. Cl.
  CPC .... *H01L 21/02521* (2013.01); *H01L 31/0322* (2013.01); *Y02E 10/541* (2013.01)

(56) References Cited

U.S. PATENT DOCUMENTS

| | | | |
|---|---|---|---|
| 5,516,412 | A | 5/1996 | Andricacos et al. |
| 6,955,747 | B2 | 10/2005 | Browne et al. |
| 7,026,258 | B2 | 4/2006 | Taunier et al. |
| 7,776,203 | B2 | 8/2010 | Taunier et al. |
| 8,741,685 | B2 | 6/2014 | Taunier et al. |
| 2005/0215079 | A1* | 9/2005 | Taunier ............... H01L 31/0322 438/796 |
| 2007/0227633 | A1* | 10/2007 | Basol ................ C25D 5/10 148/518 |

FOREIGN PATENT DOCUMENTS

| | | |
|---|---|---|
| JP | H07-54189 A | 2/1995 |
| JP | 2007-527948 A | 10/2007 |
| JP | 2008-543038 A | 11/2008 |
| JP | 2009-530812 A | 8/2009 |
| WO | WO 2004/110698 | 12/2004 |
| WO | WO 2007/108932 | 9/2007 |

OTHER PUBLICATIONS

French Search Report dated Mar. 30, 2011.
English Machine Translations of the Abstract and Application for French Application No. FR 2 839 201.
English Machine Translations of the Abstract and Application for French Application No. FR 2 849 532.
Japanese Office Action dated Apr. 28, 2015 for Application No. JP 2013-534361.

* cited by examiner

CHECKING THE STOICHIOMETRY OF I-III-VI LAYERS FOR USE IN PHOTOVOLTAIC USING IMPROVED ELECTROLYSIS CONDITIONS

The invention relates to the domain of manufacturing in thin layers I-III-VI compounds with photovoltaic properties.

In such compounds, with stoichiometry neighboring I-III-$VI_2$, the element I from the first group of the periodic table of the elements can be copper (or also silver, or even a mixture of these elements), the element III from the third group can be indium, gallium, aluminum or a mixture of these elements, and the element VI from the sixth group can be selenium, sulfur or a mixture of these elements. Such a compound globally has a chalcopyrite type crystallographic structure.

This compound in particular has excellent photovoltaic properties. It is then integrated in active, thin layer form in photovoltaic cells, in particular in solar panels.

Techniques for depositing such a thin layer on a substrate are diverse. It can involve a physical deposition (for example by spraying a target), or a chemical deposition. The present invention relates to this second deposition technique and in particular the technique of deposition by electrolysis. The substrate (for example a thin layer of molybdenum on glass) needing to receive the deposition of the thin layer is provided as an electrode immersed in an electrolytic bath composing salts of element I and/or element III and/or element VI. A voltage is applied to the electrode (relative to a reference mercury sulfate electrode) to initiate the deposition. However, such baths are judged to be unstable because of the presence of the element VI in the bath. Thus, growing a layer of global stoichiometry neighboring I-III for example and next treating the resulting layer by subsequent supply of element VI could be considered. However, here again, the growth of the I-III layer by electrolysis could turn out to be unstable and in particular the control of the stoichiometry of the I-III alloy in the final layer is not assured.

It is therefore currently preferred to deposit a multilayer structure according to a sequence of elementary layers (for example a layer of element I, then a layer of element III, and then optionally a new layer of element I and a layer of element III, etc.), and then apply a thermal treatment (typically annealing according to a selected sequence of raising, holding and lowering temperature) to obtain an "intermixed" structure, therefore mixed, of global I-III stoichiometry.

The element VI can be supplied subsequently (by thermal treatment of selenization and/or sulfuration) or at the same time as the aforementioned annealing to obtain the desired I-III-$VI_2$ stoichiometry.

The resulting layers have satisfactory photovoltaic properties by providing thereby good yields of photovoltaic cells incorporating such thin layers.

However, in cells obtained with that kind of deposition by electrolysis, electronic transport problems have been observed, owing to non-homogeneities of the photovoltaic layer.

The present invention aims to improve the situation.

For that purpose, it proposes an I-III-VI compound manufacturing process for photovoltaic applications, in thin layer form, including the steps of:
a) electrodeposition of a layer structure comprising elements I and/or III, on the surface of an electrode, and
b) incorporating at least one element VI in the structure to obtain the I-III-VI compound.

In the meaning of the invention, the electrodeposition step comprises a control of the layer thickness to less than 3% variation in uniformity of thickness over the entire surface of the electrode receiving the deposition.

This feature of thickness control over the entire deposition surface appeared particularly advantageous for the good working of a solar cell comprising such a layer structure.

Furthermore, as presented above, the I-III layer structure can be (possibly but not restrictively) obtained by depositing successive elemental layers, of elements I and III. The thickness control of each elemental layer is crucial for a satisfactory control of I-III stoichiometry (to finally obtain the wished stoichiometry I-III-$VI_2$).

Thus, in case of a layer structure comprising a succession of elemental layers of at least the respective X and Y elements, where X is an element among the elements I and III and Y is the other of the elements I and III, it is particularly advantageous that the electrodeposition step comprises a control of respective thicknesses of the elemental layers to less than 3% variation in uniformity of thickness, for control of the stoichiometry of element I relative to element III to less than 4% variation in stoichiometry of element I relative to element III over the entire surface of the layer structure.

This advantageous property has been observed on large dimension electrodes (or "substrates"), typically greater than or of 700 $cm^2$ (for example 30 cm×60 cm).

These satisfactory results can be achieved with I and III elemental layers such as based on copper (Cu) and indium (In) respectively, as well as with stacking of more than two elemental layers. For example, the layer structure can comprise at least one third element Z (for example gallium, Ga), participating as element III in the composition I-III-VI. Thus, the composition I-III, before thermal treatment and supply of the element VI, can for example be of:

Cu—In type, or even In—Cu, but also of Cu—In—Ga type, or even Cu—Ga—In.

It could be advantageous to deposit the element III (for example indium) before element I, in which case the I-III composition could for example be:

In—Ga—Cu, or even In—Cu—Ga, or, in a variant where the element Ga is deposited first, Ga—In—Cu or even Ga—Cu—In.

It is worth noting however that tests have been carried out also with an elemental layer of copper Cu and a binary alloy layer of indium-gallium (In—Ga). The thickness control of each layer has made it possible to reach, here again, a I-III stoichiometry to less than 4% variation over the entire surface of the layer structure.

In any of the cases presented above, step b) can include a previous step of annealing for intermixing the elemental layers of the multilayer structure to finally obtain a I-III alloy layer of convenient stoichiometry.

More generally, trials have been performed also for deposition of a I-III layer (for example with copper and indium salts in a same electrolysis bath) and a I-III layer has been directly obtained (without a previous stacking of elemental layers I and III), the thickness of that I-III layer being controlled also with less than 3% variation over its entire surface (the stoichiometry variation remaining below 4% in this case). Thus, the present invention aims at an application to multilayer structures as well as an application to a single layer structure I-III.

Moreover, it has been observed that thickness, stoichiometry, but also homogeneity of the layers, are respected by the implementation of the invention, at a macro scale but at a nanometric scale as well.

Thus, the electro-deposition step further comprises an homogeneity control at a nanometric scale of the thin layer structure over the entire surface of the substrate receiving the deposition.

More particularly, the layer structure has a grain roughness of dimension less than or of 50 nm. Tests presented below show indeed that a layer of element III, for example, electrodeposited according to the method of the invention, has advantageously a grain roughness of dimension less than or equal to 50 nm.

An advantageous means for achieving such properties consists of providing in particular means for stirring of the electrolytic bath in which the substrate is immersed to receive the deposit. Thus, the electrodeposition step preferably comprises an operation of mechanical sweeping of an electrolysis bath stirrer in front of the substrate surface.

In a specific implementation, the stirrer moves in straight line back-and-forth movement parallel to the surface of the substrate.

According to trials performed, which gave satisfactory results described in more detail below, the stirrer preferably comprises a cross-section having two inverted triangles where the base of the triangle closest to the substrate is parallel to the surface of the substrate. Such a stirrer shape makes it possible to achieve such features of uniformity on substrates with dimensions as large as 700 cm$^2$, and also such features of homogeneity at nanometric scale. The use of such means is particularly simple and robust for industrial scale implementation on large dimension substrates.

Thus, thanks to the implementation of the invention, the thickness variation is advantageously below 3% over the entire surface of the layer. The present invention aims therefore also at a I-III-VI compound for photovoltaic applications, and comprising less than 3% variation in uniformity of thickness over the entire layer surface.

Moreover, thanks to the implementation of the invention, the stoichiometry variation of element I relative to element III achieved in the final compound I-III-IV especially in case of a multilayer structure, is advantageously below 4% over the entire surface of the layer.

The present invention aims also at a photovoltaic cell comprising a thin layer of such a I-III-VI compound.

Other features and advantages of the invention will appear upon examination of the following detailed description and the attached drawings in which.

Figure 1:
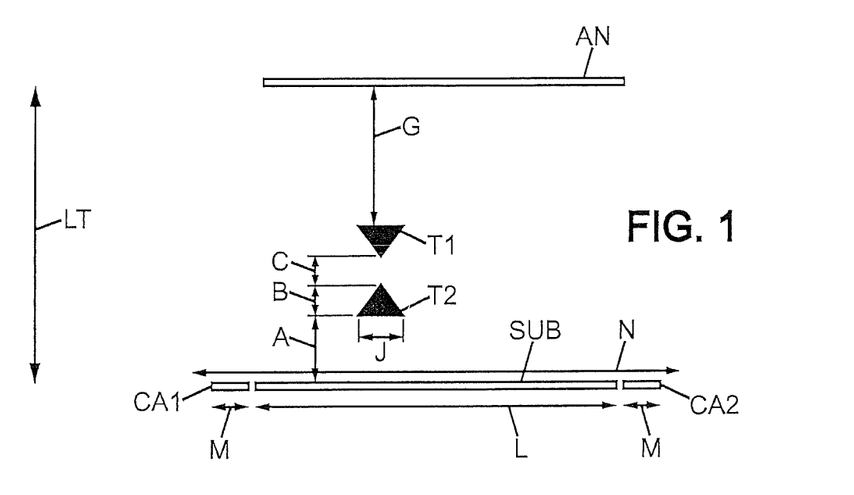
FIG. 1 schematically shows the configuration of an electrolysis bath stirrer for implementing the invention.

In reference to FIG. 1, a substrate SUB is immersed in an electrolysis bath as a cathode and an anode AN is placed opposite the substrate, which leads to transfer of the salts of elements I (such as copper) and/or element III (such as indium) towards the substrate thus forming a deposit of a thin layer of element I or element III. The stirrer T1, T2 moves parallel to the substrate over the entire length of the substrate and the entire width thereof (reference L from FIG. 1). In FIG. 1, the movement is horizontal. Here the dimension L is 300 mm. 10. The substrate is bounded by a frame CA1, CA2, such that the movement of the stirrer T1, T2 is of amplitude N extending beyond the frame. For example, if the edges CA1, CA2 of the frame have a width M of 100 mm, the total course N of the stirrer is 535 mm.

The stirrer has a cross-section (plane from FIG. 1) of two identical triangles T1 and T2, paddle shaped, where the base of triangle T2 is parallel to the surface of the substrate SUB. This base has a width J of 25 mm in an implementation example. The height B thereof is 25 mm. The gap C between the two triangles is 18 or 19 mm.

The stirrer (in particular the triangle T2) is arranged at a distance A less than 5 mm from the substrate, preferably 3 or 4 mm with the dimensions given above.

The base of the other triangle T1 is arranged at a distance G of 160 mm from the anode AN.

The total width LT of the electrolysis bath can then be of order 350 mm.

According to the trials conducted, the mechanical sweeping, preferably operated at a frequency included between 0.2 and 1.8 Hz, makes it possible to increase, in addition to the uniformity in thickness, the homogeneity at the nanometric scale.

Figure 2:
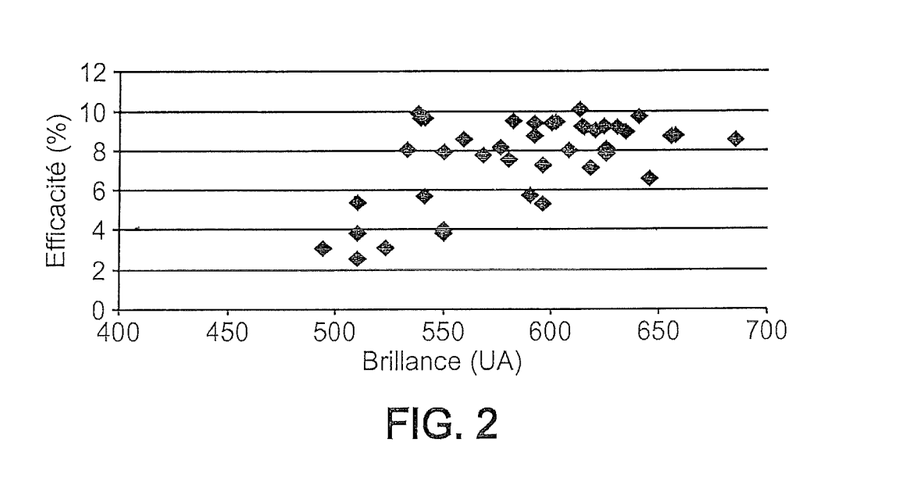
FIG. 2 illustrates the efficiency of the solar cell obtained by the process in the meaning of the invention, as a function of the brilliance of the resulting layers.

The grain fineness properties of the deposited materials can be estimated using a brilliance measurement of the deposited layer. As examples drawn from tests performed, the grain roughness from the element III layer has an average dimension of:

53 nm and influences the brilliance such that it is of order 36% (on a scale from 0 to 100%) if the sweeping frequency is of order 0.25 Hz 41 nm and influences the brilliance such that it is of order 46% (on a scale from 0 to 100%) if the sweeping frequency is of order 0.5 Hz 37 nm and influences the brilliance such that it is of order 54% (on a scale from 0 to 100%) if the sweeping frequency is of order 0.75 Hz 28 nm and influences the brilliance such that it is of order 64% (on a scale from 0 to 100%) if the sweeping frequency is of order 1 Hz Referring now to FIG. 2, the connection between the efficiency of the solar cell comprising a layer I-III-VI layer (more particularly with exact I-III-VI$_2$ stoichiometry) for which the elements I and III have been deposited by the process in the sense of the invention (ordinates) and the brilliance measured, in the example shown, on the III layer (abscissas) has therefore been demonstrated.

The brilliance measurements have been done with a brilliance meter at a wavelength of 560 nm and an incidence of 60°. The topographic measurements of the grain roughness have been done with an atomic force microscope. Thickness measurements of the layers for estimating the variation have been done by x-ray fluorescence.

Thus, for the I-III-VI thin layer solar cells manufactured by electrodeposition, the invention can propose adopting an approach which allows moving towards large dimension surfaces. A process using a vertical cell with stirrer which could previously be used for stacking semiconductor layers and microelectronic systems (the principle of which is described for example in document U.S. Pat. No. 5,516,412) has been improved in order to be able to handle thin layer solar cells with a surface area of at least 30 cm×60 cm.

The vertical cell with stirrer has made it possible to obtain uniform thin layers on a large dimension substrate by opting for an approach of multiple layers of element I (such as Cu) and III (such as In), in an example of embodiment, for the manufacturing of I-III-VI absorbing layers (referred to as "CIS") especially of p-type. Furthermore, the process here allows manufacturing a diode (such as a photovoltaic cell) of large dimension (adequate for a solar panel) by successively applying uniform layers of different materials, one over the other, and then the continuing with annealing of these thin layers in an atmosphere of element VI for example, for finally producing the I-III-VI$_2$ chalcopyrite material.

A large dimension diode is manufactured by sequential addition of uniform thin layers. The control of the composition of the CIS layer is assured through a precise control of the thickness of the thin layers of Cu, In and optionally gallium as possible other element III (Ga). The electrodeposition in the meaning of the invention in fact enables a precise control of the thickness of the ultrathin layers on a large dimension substrate. This sequential process of electrodeposition in a vertical cell with stirrer, for example for the electrodeposition of Cu, In and Ga layers, is particularly advantageous since it makes it possible to obtain an electric diode, such as a photovoltaic cell, having the properties illustrated in FIG. 2.

In practice such a process includes the following steps:
placing a rear electrode on the rear surface of a substrate such that the rear electrode comprises a contact surface against the rear surface of the substrate; and
depositing a I or III layer on an initial metallic layer (for example of molybdenum) born on the front surface of the substrate, where the I or III layer has a thickness uniformity which is located below 3% of an average thickness over the entire surface of this layer.

It involves in particular depositing at least one I layer (for example of copper Cu) and at least one III layer (for example indium In and/or gallium Ga).

Next a step can be planned consisting of:
depositing a n-type layer comprising a semiconducting material on the I-III-VI layer finally obtained, where the n-type layer forms a p-n diode junction with the I-III-VI layer.

The process can again continue with the step:
depositing a transparent conducting layer (typically ZnO).

It can be provided that the electric diode be divided into two or more auxiliary structures.

The substrate includes one or more of the following materials: glass, metal, metal sheet, stainless steel, copper sheet.

Furthermore a step can be provided consisting of smoothing the substrate before placing the rear electrode on the substrate.

Furthermore a step can be provided consisting of placing a layer forming a barrier between the substrate and the initial metallic layer.

The following steps can thus be provided:
placing the substrate in a support, where the support has an element forming a thief (the aforementioned CA1, CA2 frame) which borders at least two sides of the substrate SUB, the support comprising a support electrode, and the substrate comprising a rear electrode on the surface of the substrate;
placing the support with the substrate in a first tank, where the first tank has a first tank electrode, and the first tank furthermore contains a copper electrolyte;
exciting the support electrode and the first tank electrode by applying a difference in potential thereto while also maintaining the current density in the thief at a first thief current density and the current density in the rear electrode at a rear current density;
repeatedly moving a stirrer through the first electrolyte on the rear electrode surface at a first stirrer distance relative to the rear electrode, a first metallic layer being electrodeposited on the rear electrode such that the copper metal layer is electrodeposited with a first thickness uniformity which is located at less than 3% of the first average thickness on the entire surface of the copper metal layer;
placing the substrate with the support thereof (which may be the same as said first support) in a second tank, where the second tank has a second tank electrode, and the second tank furthermore contains an indium electrolyte;
exciting the second support electrode and the second tank electrode by applying a difference in potential thereto while also maintaining the current density in the second thief at a second thief density and the current density in the copper metal layer at a copper metal layer current density; and
optionally repeatedly moving another stirrer through the indium electrolyte on the surface of the copper metal layer at a second stirrer distance relative to the substrate, an indium metal layer being electrodeposited on the copper layer, such that the indium metal layer is electrodeposited with a second thickness uniformity which is located at less than 3% of an average thickness over the entire surface of the indium metal layer.

Thus a copper layer and then an indium layer are deposited successively.

Furthermore one can:
place the substrate with the support thereof (which may be the same as said first support), in a third tank, where the third tank has at least one third tank electrode, and the third tank furthermore contains a gallium electrolyte;
excite the third support electrode and the third tank electrode with an opposite polarity while also maintaining the current density in the third thief at a third thief density and the current density in the indium metal layer at a third metal layer current density; and
repeatedly moving a third stirrer through the gallium electrolyte on the surface of the indium metal layer at a third stirrer distance relative to the indium metal layer, a gallium metal layer being electrodeposited on the indium metal layer, such that the gallium metal layer is electrodeposited with a third thickness uniformity which is located at less than 3% of an average thickness on the entire surface of the gallium metal layer.

Thus a third layer, now of gallium, is deposited.

Of course it can be provided that:
at least two of the following elements are identical: the first tank, second tank and third tank,
and/or at least two of the following elements are identical: the first tank electrode, second tank electrode and third tank electrode,
and/or at least two of the following elements are identical: the first stirrer, second stirrer and third stirrer.

The rear electrode can be composed of one of the following elements: molybdenum, copper molybdenum, molybdenum alloy, double layer with molybdenum as first layer and a second conducting layer of copper and/or indium.

A first thief current density located between the current density in the rear electrode and a rear current density can be applied (especially in an implementation where a frame is provided for "stealing current" i.e. diverting current so that the edges of the substrate do not alter the field lines derived from the potential difference with the anode). It will thus be understood that the current density applied to the frame can be modulated relative to that applied to the substrate.

Then the following steps can be implemented:
apply the first thief current density located between 0.5 mA/cm$^2$ and 100 mA/cm$^2$ and the current density in the rear electrode at a rear current density located between 0.5 mA/cm$^2$ and 100 mA/cm$^2$;
obtain a first thickness uniformity which is located at less than 3% of the first average thickness over the entire surface of the first metal layer;
apply a second thief current density and the current density in the first metal layer at a first metal layer current density;
repeatedly move a second stirrer at a frequency included between 0.2 Hz and 1.8 Hz at a second stirrer distance relative to the substrate;
obtain a second thickness uniformity which is located at less than 3% of an average thickness over the entire surface of the second metal layer;
apply a third thief current density and the current density in the second metal layer at a second metal current density;
repeatedly move a third stirrer through the third electrolyte at a frequency of 0.3 Hz to 1.8 Hz
electrodeposit a third metal layer (for example gallium) with a third thickness uniformity which is located at less than 3% of an average thickness over the entire surface of the third metal layer.

Of course the present invention is in no way limited to the embodiments described above as examples; it extends to other variants.

Thus, in FIG. 1, it was shown that the substrate would be placed vertically in one or more tanks. As a variant, it could just as well be placed horizontally.

Moreover, a stirrer comprising a pair of inverted triangles, as represented in FIG. 1, is described above. Obviously, the stirrer may comprise more than a pair of triangles, the bases of the triangles being at least parallel between pairs.

The details of such an embodiment are described hereinafter.

In particular for substrate sizes strictly greater than 30 cm×60 cm, it has been found that the performances of deposition assisted by a stirrer according to the invention could be enhanced using a plurality of stirrers. The use of a plurality of stirrers makes it possible, as described hereinafter, to ensure deposition uniformity and quality compatible with the production of photovoltaic cells based on I-III-VI materials.

Figure 3A:
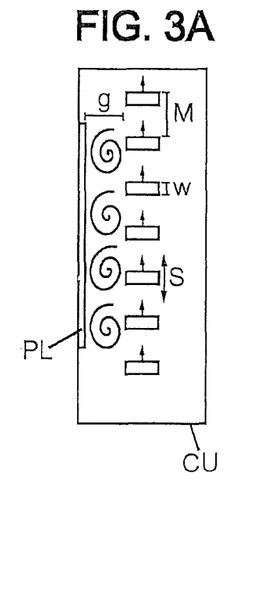
FIGS. 3A and 3B illustrate an electrolytic bath arrangement CU comprising a plurality of stirrers AG1, . . . , AGN.
Figure 3B:
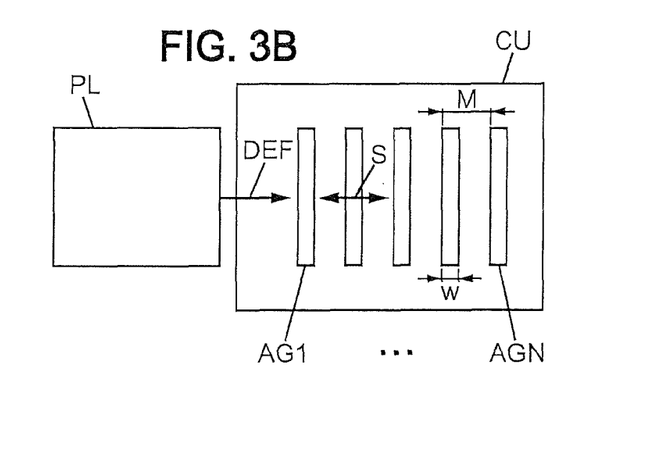

In particular, tests were carried out for the electrodeposition of indium on copper. Plates (forming deposition "electrodes") having the dimensions 60 cm×120 cm are placed on a conveyor running at a speed between 0.5 and 2 meters per minute, for example in the region of 1 meter per minute, in an electrolytic bath (or "tank"), with the deposition face facing downwards. As represented in FIGS. 3A and 3B, the 120 cm of the plate PL are counted in the direction of passage thereof (arrow DEF) in the tank CU. The length of the electrolytic tank is 90 cm and the tank comprises a plurality of stirrers AG1, . . . , AGN. The stirrers each have a back-and-forth movement (having an amplitude S), perpendicular to the major axis thereof and parallel to the direction of movement DEF of the plate. In particular, the back-and-forth movement of the stirrers is in phase, having the same speed and the same amplitude.

It was found that it is nonetheless necessary to optimize the stirring parameters since the topographic (surface) and local thickness uniformity is closely dependent on these parameters. For example, marks, parallel to the major axes of the stirrers, may appear on the depositions. These marks are associated with the formation of local stationary turbulences, induced by each stirrer. An eddy generated by each stirrer interacts with the eddy generated by the other stirrers and may give rise to screening phenomena having an impact on the local thickness of an interaction "layer" between the material to be deposited in ionic form (for example In$^{3+}$) and particularly the electrons applied to promote electrolysis. This layer is referred to as the "diffusion barrier layer". It is further necessary to define a parameter for characterizing electrolytic efficiency, referred to as the "faradaic efficiency". It involves a ratio between the amount of material actually electrodeposited and the amount of electrodeposited material expected based on the charge corresponding to the current flowing between the electrodes during electrolysis.

Homogeneity defects in this layer then have an impact on the local topography of the layer eventually electrodeposited, and consequently on the electrical properties thereof. In order to remedy the abovementioned screening phenomena, it is necessary to select the stirrer movement parameters carefully including, with reference to FIGS. 3A and 3B:
the movement amplitude S thereof,
the movement speed,
the width W of each stirrer (measured for example at the base of a triangle),
the distance M between two successive stirrers (center to center).

In one example of an embodiment, the distance M is in the region of 100 mm or 200 mm. Each stirrer displays the double triangle geometry described above. The distance g between the stirrers and the deposition electrode (FIG. 2A) is 2 mm.

Figure 4:
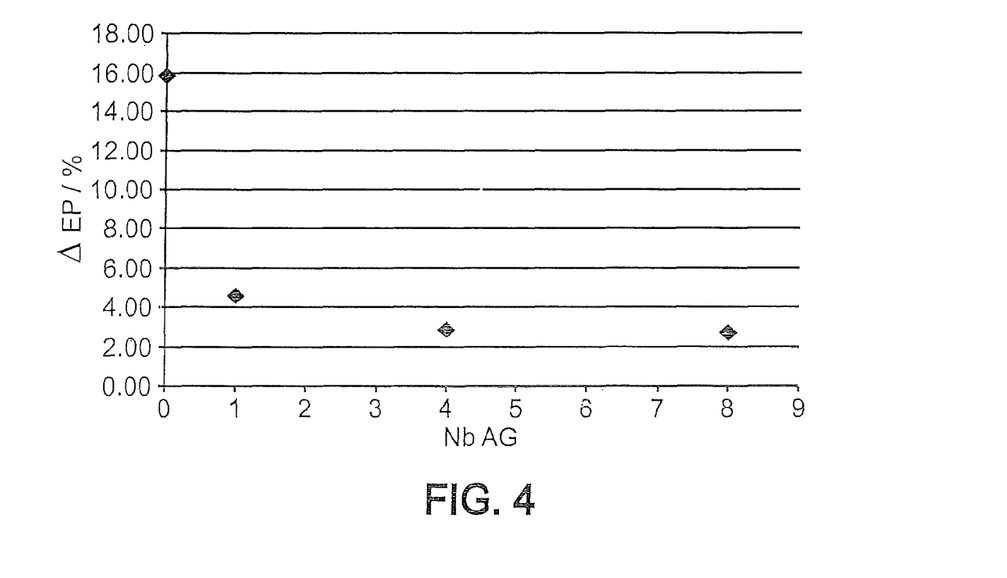
FIG. 4 illustrates the influence of the number of stirrers provided (X-values) on the statistical variation (out of 140 measurements) of the thickness of the electrodeposited layer (coefficient of variation in thickness, percentage (%), represented on the Y-axis)
Figure 5:
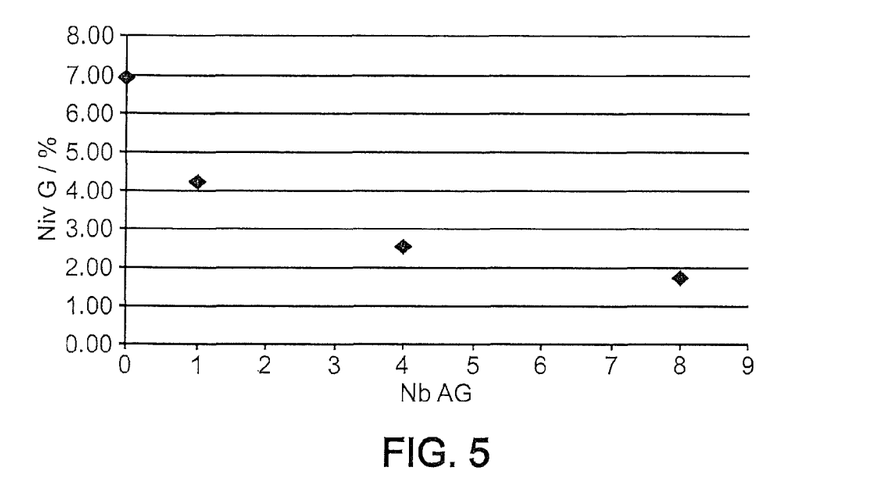
FIG. 5 illustrates the influence of the number of stirrers provided (X-values) on topographic uniformity associated with the optical reflectivity of the electrodeposited layer, and measured in this instance by grayscale (coefficient of variation in percentage (%), represented on the Y-axis)
Figure 6:
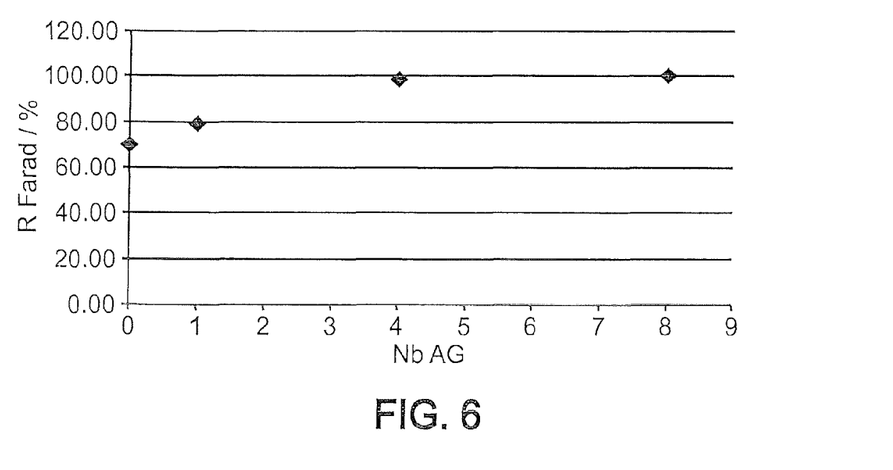
FIG. 6 illustrates the influence of the number of stirrers provided (X-values) on the faradaic efficiency of a deposition of indium (efficiency compared to a maximum, represented on the Y-axis).

More specifically, the tests conducted demonstrate results meeting the following conditions:
the movement amplitude S of each stirrer is greater than the distance M between two successive stirrers less one stirrer thickness W, and preferentially less than twice the distance M between the stirrers; it was observed that if the amplitude is less than this range, the faradaic efficiency for the deposition of indium drops and the appearance of the plate becomes "milky"; in one example of an embodiment making it possible to achieve the results described hereinafter with reference to FIGS. 4 to 6, the amplitude S may be 140 mm;
the speed of each stirrer is greater than one movement amplitude S, per second, and preferentially less than or equal to 0.2 m/s; it was observed that the "efficient" duration of the turbulence generated by each stirrer is approximately 2 seconds, such that, in order to replenish an efficient turbulence, a stirrer movement speed greater than the amplitude S per second is preferable; above 0.2 m/s, the turbulence generates an eddy not making it possible to obtain uniform depositions; in one example of an embodiment making it possible to achieve the results described hereinafter with reference to FIGS. 4 to 6, the sweeping speed is 0.16 m/s;

the mechanical sweeping operation may involve at least two stirrers and preferentially at least four stirrers, for a plate having the dimensions 60 cm×120 cm, and in one embodiment making it possible to achieve the results described hereinafter with reference to FIGS. 4 to 6, eight stirrers;

the distance M between two successive stirrers is 100 mm for eight stirrers and 200 mm for four stirrers, in the examples of embodiments, the results whereof are given hereinafter.

The results obtained are satisfactory. The following were particularly observed:

uniformity of the thickness of the electrodeposited layer (measured by means of X-ray fluorescence) with a coefficient of variation less than 3%, as shown in FIG. 4, topographic uniformity (measured by means of "gray" scale, associated with the reflectivity of the layer, thus according to an optical aspect) with a coefficient of variation less than 2% particularly for eight stirrers, as shown in FIG. 5, a distance between the abovementioned hydromechanical "marks" less than 3 cm, if identifiable.

With reference to FIG. 4, it would appear that four stirrers, for a 60 cm×120 cm plate, already makes it possible to obtain a coefficient of variation of the uniformity of indium thickness less than 3% (3% being the coefficient of variation limit value per element Cu, In and Ga, compatible with a satisfactory embodiment of a photovoltaic module). These data were measured by means of X-ray fluorescence at 140 measurement points uniformly distributed on the entire plate surface.

FIG. 6 shows the faradaic efficiency for the deposition of indium obtained with a plurality of stirrers, compared to the use of a single stirrer. It is greater than 80% (standardized with respect to the best faradaic efficiency obtained). If this efficiency is less than 80%, the appearance of the plate becomes milky, associated with poor evacuation of hydrogen formed during electrolysis. Indeed, a hydrogen formation reaction competes with the indium deposition reaction and it is necessary to evacuate the hydrogen so as not to impede the electrodeposition of indium. More specifically, the electrolysis of indium competes with that of water, giving rise to the formation of hydrogen gas. Without effective stirring, this hydrogen is not evacuated from the surface and thus reduces the fraction of an electrode surface accessible for indium deposition.

Advantageously, multiplying the number of stirrers Nb AG thus gives rise to an increase in the faradaic efficiency for the deposition of indium (by 30% following the change from no stirrers to four stirrers).

In this way, by increasing the number of stirrers per unit of tank length, a significant gain in lateral thickness uniformity may be obtained.

The results given above are compatible with the embodiment of high-performance photovoltaic cells in terms of efficiency, based on I-III-VI material.

They have been described for indium but were obtained with parameters in the same ranges for gallium and very similar parameters for copper.

The invention claimed is:

1. Manufacturing process for a compound for photovoltaic applications, in thin layer form, including the steps of:
   a) electrodeposition of a layer structure comprising a succession of elemental layers of at least the respective X and Y elements, where X is an element among the elements I and III and Y is the other of the elements I and III, on the surface of one and a same electrode, and
   b) incorporating at least one element VI in the structure to obtain the compound,
      wherein the electrodeposition step a) comprises an operation of mechanical sweeping to control the layer thickness to less than 3% variation in uniformity of thickness over the surface of the electrode receiving the deposition,
   in that the mechanical sweeping operation involves at least two electrolytic bath stirrers in front of the surface of the electrode, the two stirrers having phased back-and-forth movements parallel to the surface of the electrode, having the same speed and same amplitude,
   and in that, each stirrer having a predetermined thickness and the stirrers being spaced by a predetermined distance, the movement amplitude of each stirrer is:
      greater than the distance between the stirrers less one stirrer thickness, and
      less than twice the distance between the stirrers.

2. The manufacturing process according to claim 1, wherein the layer structure comprises a succession of elemental layers of at least the respective X and Y elements, where X is an element among the elements I and III and Y is the other of the elements I and III,
   and in that the electrodeposition step comprises a control of respective thicknesses of the elemental layers to less than 3% variation in uniformity of thickness over the entire electrode surface receiving the deposition, for control of the stoichiometry of element I relative to element III to less than 4% variation in stoichiometry of element I relative to element III over the entire surface of the layer structure.

3. The manufacturing process according to claim 1, wherein the electrodeposition step comprises additionally a control of nanometric scale homogeneity of the elemental layers over the entire surface of the electrode receiving the deposit.

4. The manufacturing process according to claim 3, wherein the layer structure has a grain roughness less than or equal to about 50 nm.

5. The manufacturing process according to claim 1, wherein each stirrer comprises a cross-section having two inverted triangles where the base of the triangle closest to the electrode is parallel to the surface of the electrode.

6. The manufacturing process according to claim 1, wherein the area of the electrode is greater than about 700 $cm^2$.

7. The manufacturing process according to claim 1, wherein the mechanical sweeping is operated at a frequency included between 0.2 and 1.8 Hz.

8. The manufacturing process according to claim 1, wherein each stirrer is arranged at a distance of less than 5 mm from the electrode.

9. The manufacturing process according to claim 1, wherein the electrode is bounded by a frame and in that the amplitude of the movement of the whole set of stirrers extends beyond the frame.

10. The manufacturing process according to claim 1, wherein the speed of each stirrer is greater than one movement amplitude, per second.

11. The manufacturing process according to claim 1, wherein the speed of each stirrer is less than or equal to 0.2 m/s.

12. The manufacturing process according to claim 1, wherein said electrode is moved in the electrolysis bath in a direction parallel to the back-and-forth movement of each stirrer, at a speed between 0.5 and 2 meters per minute.

13. The manufacturing process according to claim 1, wherein the mechanical sweeping operation involves at least four stirrers, for a plate having the dimensions 60 cm×120 cm, the 120 cm being counted in the direction of the back-and-forth movement of said stirrers.

14. The manufacturing process according to claim 1, wherein the layer structure comprises at least one third element Z participating as element III in the compound I-III-VI.

* * * * *